United States Patent
Mizuta et al.

(10) Patent No.: US 6,784,640 B2
(45) Date of Patent: Aug. 31, 2004

(54) METHOD AND APPARATUS FOR INDICATING BATTERY STATE OF HYBRID CAR

(75) Inventors: Toru Mizuta, Kakogawa (JP); Kenichi Tanimoto, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 49 days.

(21) Appl. No.: 10/367,844

(22) Filed: Feb. 19, 2003

(65) Prior Publication Data

US 2003/0155810 A1 Aug. 21, 2003

(30) Foreign Application Priority Data

Feb. 19, 2002 (JP) ........................................ 2002-041648

(51) Int. Cl.[7] .................................................. H02J 7/00
(52) U.S. Cl. ........................................................ 320/130
(58) Field of Search ................................ 320/130, 132, 320/149; 324/426, 427, 430, 434

(56) References Cited

U.S. PATENT DOCUMENTS 5,119,011 A    6/1992   Lambert ..................... 320/136
6,556,020 B1 * 4/2003   McCabe et al. ............ 324/426

OTHER PUBLICATIONS

Patent Abstracts of Japan, entitled "*Display Device for Hybrid Vehicle*", vol. 2000, No. 12, Jan. 3, 2001 & JP 2000 247164, Sep. 12, 2000.
Patent Abstracts of Japan, entitled "*Driving State Display for Electric Vehicle*", vol. 1997, No. 08, Aug. 29, 1997 & JP 09 098501, Apr. 8, 1997.
Alzieu J., et al., "*Development of an On–Board Charge and Discharge Management System for Electric–Vehicle Batteries*", Journal of Power S urces, Elsevi r Sequoia S.A. Lausanne, CH, vol. 53, No. 2, Feb. 1, 1995, pp. 327–333.

* cited by examiner

Primary Examiner—Pia Tibbits
(74) Attorney, Agent, or Firm—Wenderoth, Lind & Ponack, L.L.P.

(57) ABSTRACT

The present method for indicating a battery state of a hybrid car detects $\Delta V/\Delta I$ which is a change value of voltage and current from a first state and a second state of a battery 1 being charged/discharged. The battery state indicating method determines whether the battery is charged/discharged in a battery protective state based on the $\Delta V/\Delta I$ and indicates that the battery protective state is established when the battery is charged/discharged in a protective state.

22 Claims, 2 Drawing Sheets

METHOD AND APPARATUS FOR INDICATING BATTERY STATE OF HYBRID CAR

This application is based on Application No. 2002-41648 filed in Japan on Feb. 19, 2002, the content of which is incorporated hereinto by reference.

BACKGROUND OF THE INVENTION

1. Field of the Invention

The present invention relates to a method and an apparatus for indicating a battery state which indicates that a battery of hybrid car is charged/discharged in such a mild condition that elongates the battery life.

2. Background of the Related Art

A hybrid car is driven by an engine and a motor. The motor is driven by a battery. The battery which drives the motor is charged/discharged under very severe conditions, because it is discharged with a large current at the time of acceleration of a heavy vehicle, and charged with a large current at the time of breaking. In particular, at the time of hard acceleration and hard braking, the battery is charged/discharged with an extremely large current. For this reason, a battery of a hybrid car is requested to have long life although it is used under such severe conditions. This is because the battery is configured by a number of secondary batteries connected in serial, and hence the production cost is very high. The life of a battery is influenced by a driving condition of the hybrid car. For example, in the case of a driver who often uses hard acceleration and hard braking, the battery suffers great damage so that its useful life is shortened.

The life can be elongated by restricting the current with which the battery is charged/discharged. However, restricting the current for charging/discharging will result in decrease in the effect specific to a hybrid car which travels with the assistance of a motor and a battery, so that the advantage specific to the hybrid car is lost. Substantially this equals to miniaturizing the motor and the battery, and the traveling condition of the hybrid car is significantly deteriorated. For example in the case where the current for discharging is restricted, the acceleration performance is deteriorated, while in the case where the current for charging is restricted, the charging efficiency is deteriorated so that effective regenerative braking is impossible. Further difficulty is that since the condition of accelerating and braking differs depending on the driver, acceleration is least effective when a driver who drives gently operates the hybrid car. On the other hand, a driver who wants to accelerate hardly by hitting the accelerator feels such poor acceleration unsatisfactory. For this reason, in order to realize a desirable running condition in the hybrid car, it is impossible to restrict the current for charging/discharging. Consequently, the life of the battery is significantly shortened depending on the driver. In particular, since a driver cannot know the relationship between the driving condition and the life of the battery, she/he unconsciously shortens the life of the battery.

Furthermore, a hybrid car calculates the remaining capacity of the battery and controls charging/discharging so that the remaining capacity is in the vicinity of approximately 50% of the full-charge capacity. This is because charging/discharging at this remaining capacity provides the longest life of the battery. However, if an error occurs in the calculation of the remaining capacity, the remaining capacity of the battery is actually no longer charged/discharged in this range, so that the life of the battery is shortened. The remaining capacity can be corrected by battery voltage. This is because the battery voltage is one of the parameters for remaining capacity, as such the smaller the remaining capacity the lower the battery voltage becomes. Moreover, the remaining capacity can be corrected more accurately by means of current and voltage. This is because the battery voltage varies according to the magnitude of the current. When the remaining capacity is corrected by means of current and voltage, $\Delta V/\Delta I$ which is a change value of voltage and current is detected. However, if the current for charging/discharging rapidly increases or decreases, it is impossible to detect $\Delta V/\Delta I$ with accuracy. For this reason, it is impossible to accurately correct the remaining capacity from the $\Delta V/\Delta I$. Accordingly, an error is likely to occur in calculation of the remaining capacity, which results in reduction of the battery life.

The present invention was developed so as to eliminate the adverse effect as described above. It is a primary object of the present invention to provide a method for indicating a battery state of a hybrid car which indicates that the battery is used in a gentle environment wherein deterioration of battery is small, or that the battery is in the protective state, thereby enabling a driver to drive while being aware of the battery life.

SUMMARY OF THE INVENTION

A method for indicating a battery state of a hybrid car according to the present invention detects $\Delta V/\Delta I$ which is a change value of voltage and current from a first state and a second state of a battery 1 being charged/discharged. The method for indicating a battery state determines whether the charging/discharging is performed in a battery protective state based on $\Delta V/\Delta I$ and indicates that the battery protective state is established when the charging/discharging is performed in a protective state.

The method for indicating a battery state can determine that the battery protective state is established when the change in current for charging/discharging is smaller than a preset range.

An, apparatus for indicating a battery state of a hybrid car according to the present invention comprises a determination circuit 5 which detects $\Delta V/\Delta I$ which is a change value of voltage and current from a first state and a second state of a battery 1 being charged/discharged and determines whether the charging/discharging is performed in a battery protective state based on $\Delta V/\Delta I$, and a display 6 for indicating that the battery protective state is established when it is determined that the battery 1 is charged/discharged in a protective state.

The above-mentioned method for indicating a battery state can indicate that the charging/discharging is performed in the condition of being used in a gentle environment involving less deterioration of battery, or the battery protective state, and enables the driver to drive while being aware of the battery life. This is because the above-mentioned method for indicating a battery state detects $\Delta V/\Delta I$ of the battery being charged/discharged and determines whether the battery protective state is established using the $\Delta V/\Delta I$ as a parameter. When the hybrid car is driven gently without frequent hitting of the accelerator pedal and the brake pedal, the change in charging/discharging current of the battery is reduced. In the condition that the change in charging/discharging current is small, $\Delta V/\Delta I$ of the battery can be detected with accuracy. Therefore, by detecting $\Delta V/\Delta I$, it is possible to determine whether or not the driver drives the hybrid car gently. In addition, since a substantial internal impedance of the battery can be detected from $\Delta V/\Delta I$, it is possible to calculate the remaining capacity with accuracy by correcting the battery voltage using this internal impedance. It is also possible to protect the battery so as to be charged/discharged at an optimum remaining capacity by Judging overcharge and over-discharge of the battery using the value of the detected $\Delta V/\Delta I$ or detecting deep charging/discharging.

The above and further objects and features of the invention will more fully be apparent from the following detailed description with accompanying drawings.

DETAILED DESCRIPTION OF PREFERRED EMBODIMENTS

Figure 1:
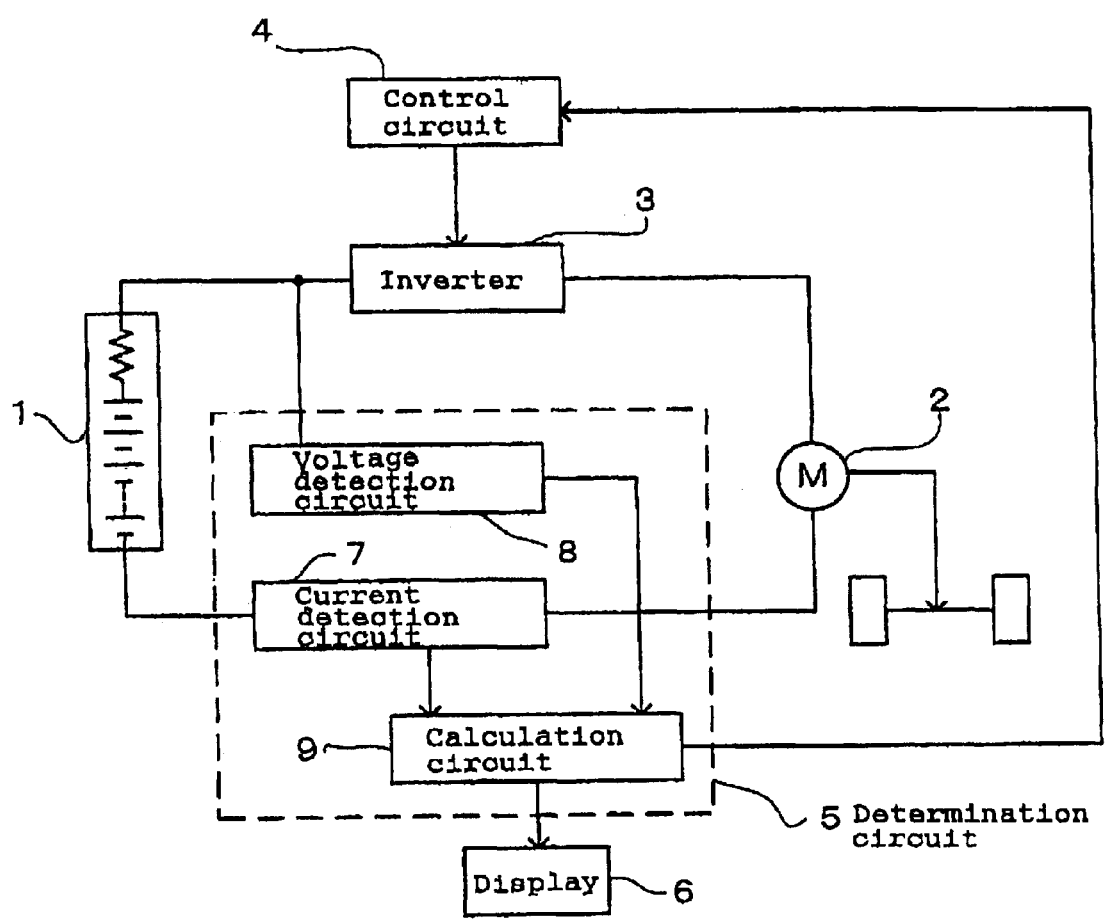
FIG. 1 is a circuit diagram of a hybrid car equipped with a battery state indicating apparatus according to one embodiment of the present invention.

FIG. 1 is a circuit diagram of a hybrid car. The hybrid car shown in FIG. 1 includes a battery 1 for supplying a motor 2 with electric power to drive the same, an inverter 3 for controlling the electric power to be supplied to the battery 1 to supply it to the motor 2, a control circuit 4 for controlling the inverter 3 according to the accelerator, the remaining capacity of the battery 1 and the like, a determination circuit 5 for detecting $\Delta V/\Delta I$ of the battery 1 and determining whether a battery protective state is established, and a display 6 for indicating that the battery protective state is established when the determination circuit 5 determines that the battery protective state is established.

The battery 1 consists of a number of secondary batteries connected in serial. In the battery 1, a plurality of secondary batteries are connected in serial to form an individual battery module, and these battery modules are connected in serial. The secondary battery is a nickel-hydrogen battery, however, a lithium ion secondary battery and nickel-cadmium battery may also be used.

It is able to correct the remaining capacity by detecting the voltage of battery 1 accurately. This is because the battery voltage is one of the parameters that define the remaining capacity. The battery voltage can be detected with accuracy by detection of output voltage in the non-load condition where a current is not fed through the battery 1. However, in the condition where a current is fed through the battery 1, even if an output voltage is detected, the detected voltage is not necessary an actual voltage of the battery 1. This is because a voltage drop due to internal impedance of the battery 1 lowers the output voltage of the battery 1. The voltage drop due to the internal impedance can be calculated by the product of the value of the internal impedance and the flowing current. Therefore, in order to accurately detect the battery voltage, it is necessary to detect the internal impedance and the current with accuracy.

The internal impedance of the battery 1 is not usually a constant value. For example, it changes depending on the remaining capacity of the battery 1. The internal impedance increases in the condition that the battery 1 is fully-charged or overcharged and the condition that the battery 1 is fully-discharged or over-discharged, whereas the internal impedance decreases in the condition that the remaining capacity is at the middle level. The internal impedance of the battery 1 can be calculated by detecting $\Delta V/\Delta I$. Herein it is to be noted that the internal impedance calculated from $\Delta V/\Delta I$ of the battery 1 does not accurately coincide with the actual internal impedance of the battery 1. However, the internal impedance calculated from $\Delta V/\Delta I$ is approximate to the actual internal impedance of the battery 1. Therefore, the voltage of the battery 1 can be accurately calculated by calculating the internal impedance from $\Delta V/\Delta I$, calculating a voltage drop in the condition where a current is fed, from the internal impedance, and adding the calculated value to the output voltage of the battery 1.

Figure 2:
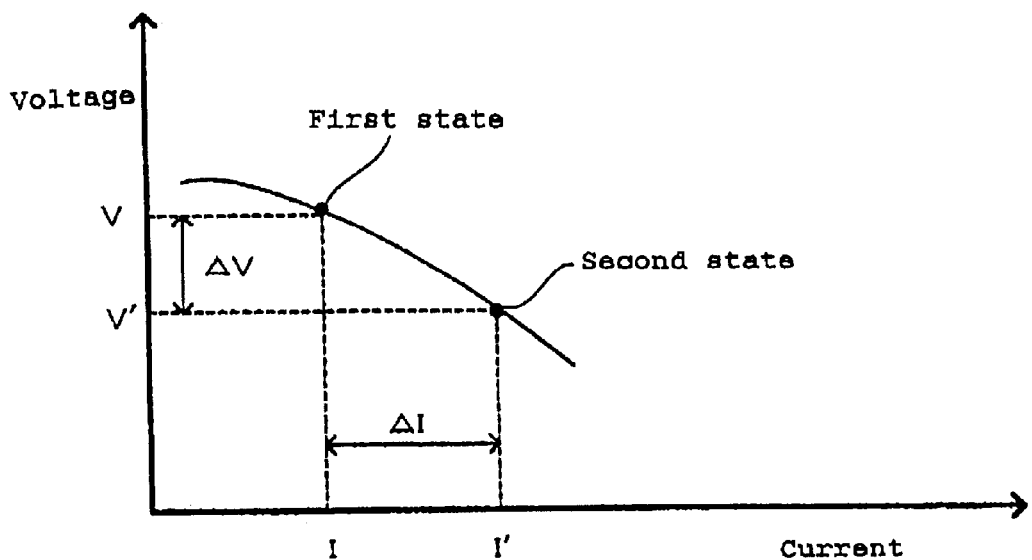
FIG. 2 is a graph showing characteristics of output current and output-voltage of the battery.
Figure 3:
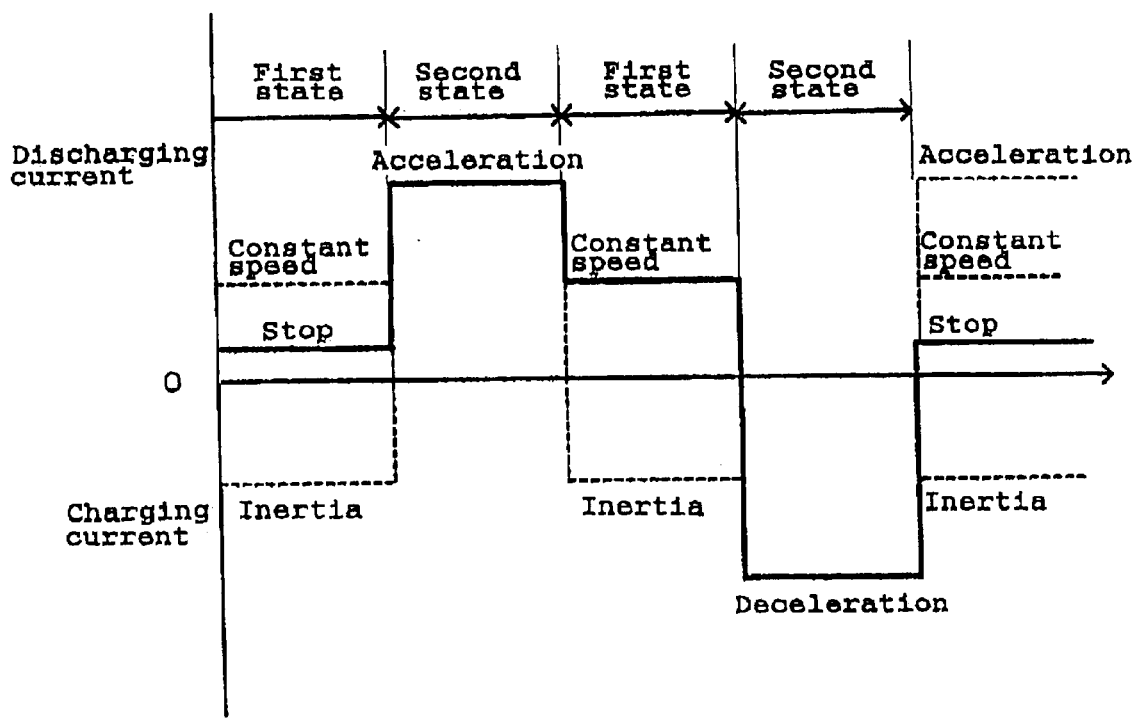
FIG. 3 is a graph showing the condition that the battery current changes depending on the running condition of the hybrid car.

$\Delta V/\Delta I$ is a change value of voltage and current. Therefore, when characteristics of output current and output voltage of the battery 1 change in the manner as illustrated in FIG. 2, currents and voltages are detected in a first state and in a second state where current values are different from each other, and $\Delta V/\Delta I$ can be calculated from the differences in current and voltage. When the hybrid car travels while driving the motor 2 by means of the battery 1, as shown in FIG. 3, the current flowing through the battery 1 changes depending on the running condition of the hybrid car. The hybrid car discharges the battery 1 for driving the motor 2 during acceleration, while charging the battery 1 by regenerative braking during braking. When the hybrid car is strongly accelerated or strongly decelerated, the discharging current and the charging current of the battery 1 become large. Since acceleration and deceleration change according to the condition in which the driver presses the accelerator pedal or the brake pedal, also the discharging current and the charging current change in accordance with the operating condition. $\Delta V/\Delta I$ of the battery 1 cannot be accurately detected when the charging/discharging current is variable. Therefore, in order to detect $\Delta V/\Delta I$ with accuracy, it is necessary to execute calculation from the first state and the second state where the battery current is not variable. In addition, the conditions where the current of charging/discharging of the battery 1 does not rapidly change include the condition that the hybrid car is stopped or traveling at a constant speed, and the condition that the hybrid car is accelerated or decelerated at a constant acceleration. Therefore, $\Delta V/\Delta I$ of the battery 1 can be accurately detected in the condition that the hybrid car is stopped or traveling at a constant speed, and in the condition that the hybrid car is accelerated or decelerated at a constant acceleration. Once $\Delta V/\Delta I$ of the battery 1 is detected with accuracy, it is possible to accurately correct the remaining capacity based on the $\Delta V/\Delta I$ thus detected. Therefore, while accurately detecting the actual remaining capacity of the battery 1, it is possible to perform charging/discharging within the range of the designated remaining capacity that allows charging/discharging while protecting the battery 1 and not causing overcharge and over-discharge of the battery 1. Accordingly, it is possible to perform charging/discharging while protecting the battery 1. In addition, since the driving condition wherein acceleration or deceleration is effected at a constant acceleration is not a driving condition wherein the accelerator is changed busily, or in other words, a driving condition wherein rapid acceleration and deceleration are repeated, it is possible to realize charging/discharging while protecting the battery 1.

The determination circuit 5 detects $\Delta V/\Delta I$ of the battery 1 and determines whether the battery protective state is established. The determination circuit 5 shown in FIG. 1 includes a current detection circuit 7 for detecting current of the battery 1, a voltage detection circuit 8 for detecting voltage of the battery 1, and a calculation circuit 9. The current detection circuit 7 detects current of the battery 1 and outputs a current signal to the calculation circuit 9. The voltage detection circuit 8 detects voltage of the battery 1 and outputs a voltage signal to the calculation circuit 9. The determination circuit 5 detects $\Delta V/\Delta I$ which is a change value of voltage and current from the first state and the second state of the battery 1 being charged/discharged. The condition where $\Delta V/\Delta I$ can be detected is determined as being charged/discharged in the battery protective state. In the battery 1, since it can detect $\Delta V/\Delta I$ when the change in charging/discharging current is smaller than a preset range, it is possible to determine this state as being in the battery protective state.

When the hybrid car is accelerated or decelerated in a smooth manner, the determination circuit 5 detects $\Delta V/\Delta I$ and determines that the battery protective state is established. When the hybrid car is smoothly accelerated, $\Delta V/\Delta I$ is detected and it is determined that the battery protective state is established, for example as shown in FIG. 3, the condition that the hybrid car is temporarily stopping due to waiting at stoplights or the like is defined as the first state, and the condition that the motor 2 is supplied with a current from the battery 1 at a constant current following starting and smooth accelerating is defined as the second state. In such a case, the battery current differs between the first state and the second state; however, the change in battery current is small in the first state as well as in the second state. If deceleration is effected during acceleration, the battery current rapidly transits from the discharging current to the charging current, so that $\Delta V/\Delta I$ is not detected. Therefore, when deceleration is effected during acceleration, it is determined that the battery protective state is not established.

It is noted that the first state is not necessary the condition that the hybrid car is temporarily stopping. The first state maybe a condition that the hybrid car is driven at a constant speed, or decelerated by energy of inertial rolling resistance. These cases also exhibit small change in current for charging/discharging of the battery 1. As shown by broken lines in FIG. 3, the determination circuit 5 detects $\Delta V/\Delta I$ while regarding the condition that the hybrid car is driven at a constant speed or decelerated by inertia as the first state, and the condition that a constant current is supplied from the battery 1 to the motor 2 following subsequent smooth acceleration as the second state.

In the case where the hybrid car is decelerated in a smooth manner and the determination circuit 5 detects $\Delta V/\Delta I$ and determines that the battery protective state is established, the condition that the hybrid car is driven at a constant speed after completion of acceleration or the condition that the hybrid car is decelerated by energy of inertial rolling resistance is regarded as the first state, and the condition that the hybrid car is decelerated by regenerative braking at a constant acceleration and the battery 1 is charged with a constant current is regarded as the second state. Also in this case, the battery current differs between the first state and the second state, however, the change in battery current is small in the first state as well as in the second state. If acceleration is effected during deceleration, the battery current rapidly transits from the charging current to the discharging current, so that $\Delta V/\Delta I$ is not detected. Therefore, when acceleration is effected during deceleration, the determination circuit 5 determines that the battery protective state is not established.

Alternatively, the determination circuit 5 may regard the condition that the hybrid car is decelerated by regenerative braking at a constant acceleration and the battery 1 is charged with a constant current as the first state, and the condition that the hybrid car is stopped as the second state. Also in this case, the battery current differs between the first state and the second state, however, the change in battery current is small in the first state as well as in the second state. Moreover, according to this determination method, the second state is not necessary the condition that the hybrid car is stopped, but may be the condition that the change in charging/discharging current of the battery 1 is small, for example the condition that the hybrid car is accelerated at a constant acceleration, the condition that the hybrid car is driven at a constant speed, and the condition of being decelerated by energy of inertial rolling resistance.

The determination circuit 5 detects $\Delta V/\Delta I$ and determines that the battery protective state is established when the change in battery current is smaller than a first preset range in the first state and when the change in battery current is smaller than a second preset range in the second state. The first preset range and the second preset range are such that the change width of current with respect to an average current is, for example, not more than ±30%, preferably not more than ±20%, more preferably not more than ±10%.

The determination circuit 5 can indicate the condition of the period until $\Delta V/\Delta I$ is detected in the second state and the condition that detection of $\Delta V/\Delta I$ is possible in the second state in different representations of battery protective state. For example, it is possible to determine the condition of the period until $\Delta V/\Delta I$ is detected in the second state as the first battery protective state, and the condition that detection of $\Delta V/\Delta I$ is possible in the second state as the second battery protective state. The first battery protective state refers to the condition that the change in battery current is smaller than a preset range during the period from the first state until $\Delta V/\Delta I$ its detected in the second state. During the period until $\Delta V/\Delta I$ is detected in the second state, if the condition comes where $\Delta V/\Delta I$ cannot be detected after determining that the first battery protective state is established, the determination circuit 5 determines that the first battery protective state is not established.

Once reaching to a constant speed by smooth acceleration, a hybrid car is no longer accelerated, or driven in a variety of driving patterns including repetition of acceleration and deceleration. In this condition, the battery 1 is repeatedly charged/discharged and hence the current thereof is variable. Therefore, after determination of the second battery protective state is made, if the charging/discharging current of the battery 1 becomes variable, the determination that the second battery protective state is established is canceled. Alternatively, the second battery protective state may be canceled after a certain time has lapsed by means of a timer. Thereafter, when the hybrid car is driven at a constant speed or stopped by smooth deceleration due to stop signals or the like, the first state is detected and it is determined that the first battery protective state is established, and thereafter when $\Delta V/\Delta I$ is detected in the second state, it is determined that the second battery protective state is established. Thereafter, when the hybrid car is smoothly accelerated, it is determined that the second battery protective state is established instead of the first battery protective state. When the hybrid car is smoothly accelerated or decelerated, the first battery protective state and the second battery protective state are determined as described above. However, in the case where the hybrid car is not smoothly accelerated or decelerated, $\Delta V/\Delta I$ is not detected, so that the determination of the second battery protective state is not made. When the hybrid car is stopped, the first state is detected, however, if the hybrid car is rapidly accelerated in the condition that the acceleration is changing or decelerated during acceleration, it is determined that the first battery protective state is not established. Also if the hybrid car is accelerated during deceleration, the first battery protective state is canceled.

When it is determined that hybrid car is in the battery protective state, the display 6 indicates the fact by way of a light source such as light-emitting diode. It is to be noted that the display 6 may indicate the battery protective state using graphics and characters on a monitor. The display 6 which indicates the battery protective state by way of a light source indicates the first battery protective state by blinking the light source. It indicates the second battery protective state by continuously lighting the light source. Also the light source may indicate the first battery protective state and the second battery protective state by changing the color of light emission. For example, the first battery protective state may be indicated by lighting a green light-emitting diode, while the second battery protective state may be indicated by lighting a blue or white light-emitting diode. Moreover, the display may indicate that $\Delta V/\Delta I$ is not detected by lighting a red light-emitting diode when the first battery protective state or the second battery protective state is cancelled.

Furthermore, by providing a switch (not shown), the display 6 may switch between the state where the battery protective state is indicated and the state where the battery protective state is not indicated. This display 6 has an advantage that the switch can be turned off when the driver cannot concentrate on the safety driving because she/he is distracted by the display 6.

The control circuit 4 corrects the remaining capacity of the battery 1 on the basis of $\Delta V/\Delta I$ detected by the determination circuit 5. Based on the remaining capacity thus corrected, the control circuit 4 controls the inverter 3 to control the supply power from the battery 1 to the motor 2. Since $\Delta V/\Delta I$ is a value which is equivalent to the internal impedance of the battery 1, a value similar to the substantial internal impedance of the battery 1 is detected from $\Delta V/\Delta I$ and a voltage drop due to current is calculated based on this value. After the voltage drop due to the internal impedance is detected, a correct voltage of the battery 1 in the condition that a current is fed is calculated. In the condition that the battery 1 is being discharged, the value obtained by adding an output voltage of the battery 1 to the voltage drop of the internal impedance is a correct voltage of the battery 1. Furthermore, in the condition that the battery 1 is being charged, the value obtained by subtracting the voltage drop of the internal impedance from an output voltage of the battery 1 is a correct voltage of the battery 1. The control circuit 4 corrects the remaining capacity from a correct voltage of the battery 1. Furthermore, as the battery 1 goes into overcharge and over-discharge conditions or conditions similar to these conditions, $\Delta V/\Delta I$ increases, and when the value of $\Delta V/\Delta I$ becomes large, the control circuit 4 controls the inverter 3 so as to stop charging/discharging of the battery 1, thereby protecting the battery 1.

The control circuit 4 controls the inverter 3 in accordance with the remaining capacity of the battery 1 and an input signal from the accelerator or the like so as to control the power to be supplied from the battery 1 to the motor 2, thereby allowing the hybrid car to run. On the other hand, when the hybrid car is decelerated, regenerative braking is effected in consideration of the remaining capacity of the battery 1, thereby controlling the charging current of the battery 1.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method for indicating a battery state of a hybrid car, the method comprising the steps of:

detecting $\Delta V/\Delta I$ which is a change value of voltage and current from a first state and a second state of a battery being charged/discharged; and determining whether charging/discharging is performed in a battery protective state based on the $\Delta V/\Delta I$, and indicating that the battery protective state is established when charging/discharging is performed in the protective state.

2. The method for indicating a battery state of a hybrid car according to claim 1, wherein determination for the battery protective state is made when a change in charging/discharging current is smaller than a preset range.

3. The method for indicating a battery state of a hybrid car according to claim 2, wherein $\Delta V/\Delta I$ is detected and determination for the battery protective state is made when a change in battery current is smaller than a first preset range in the first state, and when a change in battery current is smaller than a second preset range in the second state.

4. The method for indicating a battery state of a hybrid car according to claim 3, wherein the first preset range and the second preset range is set so that a width of variation of current with respect to an average current is not more than ±30%.

5. The method for indicating a battery state of a hybrid car according to claim 3, wherein the condition until $\Delta V/\Delta I$ is detected in the second state is determined as a first battery protective state, and the condition that $\Delta V/\Delta I$ is detected in the second state is determined as a second battery protective state.

6. The method for indicating a battery state of a hybrid car according to claim 5, wherein the condition that the change in battery current is smaller than a preset range during the period from the first state until $\Delta V/\Delta I$ is detected in the second state is determined as the first battery protective state.

7. The method for indicating a battery state of a hybrid car according to claim 6, wherein if the condition comes where $\Delta V/\Delta I$ cannot be detected after determining that the first battery protective state is established, it is determined that the first battery protective state is not established.

8. The method for indicating a battery state of a hybrid car according to claim 5, wherein after determination of the second battery protective state is made, if the charging/discharging current of the battery becomes variable, the determination that the second battery protective state is established is canceled.

9. The method for indicating a battery state of a hybrid car according to claim 5, wherein the second battery protective state is canceled after a certain time has lapsed.

10. The method for indicating a battery state of a hybrid car according to claim 1, wherein the battery protective state is indicated by a light source.

11. The method for indicating a battery state of a hybrid car according to claim 1, wherein the battery protective state is indicated by graphics or characters.

12. The method for indicating a battery state of a hybrid car according to claim 1, wherein the remaining capacity of the battery corrected on the basis of $\Delta V/\Delta I$.

13. An apparatus for indicating a battery state of a hybrid car, the apparatus comprising:
- a determination circuit for detecting $\Delta V/\Delta I$ which is a change value of voltage and current from a first state and a second state of a battery being charged/discharged; and
- a display for indicating that the battery protective state is established when the determination circuit determines that charging/discharging is performed in the protective state.

14. The apparatus for indicating a battery state of a hybrid car according to claim 13, wherein the determination circuit detects $\Delta V/\Delta I$ and determines that the battery protective state is established when a change in battery current is smaller than a first preset range in the first state, and when a change in battery current is smaller than a second preset range in the second state.

15. The apparatus for indicating a battery state of a hybrid car according to claim 14, wherein the determination circuit uses the first preset range and the second preset range set so that a width of variation of current with respect to an average current is not more than ±30%.

16. The apparatus for indicating a battery state of a hybrid car according to claim 14, wherein the determination circuit determines the condition until $\Delta V/\Delta I$ is detected in the second state as a first battery protective state, and the condition that $\Delta V/\Delta I$ is detected in the second state as a second battery protective state.

17. The apparatus for indicating a battery state of a hybrid car according to claim 16, wherein the determination circuit determines the condition that the change in battery current is smaller than a preset range during the period from the first state until $\Delta V/\Delta I$ is detected In the second state as the first battery protective state.

18. The apparatus for indicating a battery state of a hybrid car according to claim 17, wherein if the condition comes where $\Delta V/\Delta I$ cannot be detected after determining that the first battery protective state is established, the determination circuit determines that the first battery protective state is not established.

19. The apparatus for indicating a battery state of a hybrid car according to claim 16, wherein if the charging/discharging current of the battery becomes variable after determination of the second battery protective state is made, the determination circuit cancels the determination that the second battery protective state is established.

20. The apparatus for indicating a battery state of a hybrid car according to claim 16, wherein the determination circuit cancels the second battery protective state is canceled after a certain time has lapsed.

21. The apparatus for indicating a battery state of a hybrid car according to claim 13, wherein the display indicates the battery protective state by a light source.

22. The apparatus for indicating a battery state of a hybrid car according to claim 13, wherein the display indicates the battery protective state by graphics or characters.

* * * * *